(12) United States Patent
Nunokawa et al.

(10) Patent No.: US 6,392,461 B2
(45) Date of Patent: May 21, 2002

(54) CLOCK MODULATOR

(75) Inventors: Hideo Nunokawa; Naoto Emi; Tomonari Morishita, all of Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/774,689

(22) Filed: Feb. 1, 2001

(30) Foreign Application Priority Data

May 29, 2000 (JP) .................................. 2000-158653

(51) Int. Cl.[7] .............................................. H03H 11/26
(52) U.S. Cl. .................................. 327/277; 327/263
(58) Field of Search ................................. 327/277, 263, 327/264, 270, 271, 272, 276, 278, 284, 261

(56) References Cited

U.S. PATENT DOCUMENTS

| | | | | |
|---|---|---|---|---|
| 4,754,164 A | * | 6/1988 | Flora et al. | 327/284 |
| 5,719,515 A | * | 2/1998 | Danger | 327/270 |
| 5,796,673 A | * | 8/1998 | Foss et al. | 327/284 |
| 5,936,678 A | * | 8/1999 | Hirashima | 327/263 |
| 5,945,862 A | * | 8/1999 | Donnelly et al. | 327/278 |
| 5,994,938 A | * | 11/1999 | Lesmeister | 327/277 |
| 6,100,735 A | * | 4/2000 | Lu | 327/271 |
| 6,104,223 A | * | 8/2000 | Chapman et al. | 327/276 |
| 6,205,083 B1 | * | 3/2001 | Foss et al. | 327/284 |
| 6,229,364 B1 | * | 5/2001 | Dortu et al. | 327/270 |

* cited by examiner

*Primary Examiner*—Toan Tran
*Assistant Examiner*—Linh Nguyen
(74) *Attorney, Agent, or Firm*—Staas & Halsey LLP

(57) ABSTRACT

A clock modulator for in-vehicle electronic equipment requiring an EMI countermeasure optimally reduces undesired radiant noise by a low spectral dispersion number.

A delay circuit has delay buffers DB0 to DB30 connected in series with each other, each outputting an output pulse delayed from an input pulse by a phase delay time τ, and a selection circuit sequentially selecting an output pulse outputted from each of the delay buffers DB0 to DB30. Adjustment is made such that with respect to an input CLK inputted to the delay buffer DB0, a phase variation amount of the output pulse from the delay buffer DB0 and a phase variation amount of the output pulse from the delay buffer DB30 are near ±45° when a phase of the output pulse from the delay buffer DB15, at a center position of the delay buffers DB0 to DB30, is made a reference.

4 Claims, 3 Drawing Sheets

CLOCK MODULATOR

BACKGROUND OF THE INVENTION

1. Field of the Invention

The present invention relates to a clock modulator for use in reducing electromagnetic wave interference (ElectroMagnetic Interference; EMI), and particularly to a clock modulator suitably used for an in-vehicle electronic equipment requiring an EMI countermeasure.

2. Description of the Related Art

In recent years, an LSI substrate on which an LSI (Large Scale Integrated Circuit) operating in synchronization with a clock, such as a microcomputer or an ASIC (IC for special use), has been used for various devices. For example, a car navigation system as an in-vehicle electronic equipment has a built-in LSI substrate on which a microcomputer or an ASIC operating at a fundamental clock frequency of several tens MHz is mounted. However, since a harmonic component of the fundamental clock frequency of a clock pulse for operating the microcomputer or the ASIC overlaps with a frequency of an FM band (66 MHz to 108 MHz) used in an in-vehicle radio, in order to keep the quality of the in-vehicle radio, it becomes necessary to take an EMI countermeasure to reduce undesired radiation noise of the harmonic component.

As a method of the EMI countermeasure, there is a method in which with respect to a frequency spectrum of a fundamental clock pulse, a fundamental frequency and its harmonic component are respectively made center frequencies, and respective spectra are dispersed to both sides of the respective center frequencies with the elapse of time, so that the level of the undesired radiation noise is reduced.

The dispersion of a spectrum can be obtained by continuously phase modulating a fundamental clock pulse. For example, U.S. Pat. No. 5,442,664 discloses a phase modulation clock pulse generator set forth below.

A modulator for the phase modulation clock pulse generator receives clock pulses exhibiting a reference phase from a clock pulse source. A delay circuit is connected to the clock pulse source, and this delay circuit includes n tap connections. Each of the tap connections provides a clock pulse that is delayed by a different phase delay from the reference phase. A multiplexer is connected to each of the n tap connections, and this multiplexer provides an output manifesting the clock pulses. A selector circuit controls the multiplexer to sequentially connect any sequence of different ones of the n tap connections to the multiplexer's output, whereby the output manifests a series of clock pulses which have different phase displacements from the reference phase.

By using this sort of phase modulation clock pulse generator, phase modulated clock pulses can be obtained, and it becomes possible to reduce the undesired radiation noise by the spectral dispersion. Meanwhile, if the dispersion number of the spectrum of each frequency is increased, the circuit scale of a circuit used for the EMI countermeasure is enlarged. On this account, there occurs a problem that it is impossible to avoid an increase in a circuit area of an LSI substrate in which the EMI countermeasure is taken and an increase in the cost thereof.

SUMMARY OF THE INVENTION

An object of the present invention is to provide a clock modulator which can reduce undesired radiation noise by a low spectral dispersion number.

The above object is achieved by a clock modulator comprising a delay circuit in which delay elements of plural stages are connected in series with each other, each outputting an output pulse delayed from an input pulse by a phase delay time $\tau$, and a selection circuit for sequentially selecting the output pulse outputted from each of the delay elements of the plural stages, and the clock modulator is characterized in that with respect to a fundamental clock pulse inputted to the delay element of the first stage, a phase variation amount of the output pulse from the delay element of the first stage and a phase variation amount of the output pulse from the delay element of a final stage are near $\pm 45°$ when a phase of the output pulse from the delay element at a center position of the delay elements of the plural stages is made a reference.

In the structure of the present invention, the output pulses are sequentially selected by repeating ascending order and descending order operations, so that the spectral dispersion of dispersion number 2 is obtained. As shown in FIG. 3 of the present embodiment, if the phase variation amount of the output pulse from the delay element of the first stage and the phase variation amount of the output pulse from the delay element of the final stage are near $\pm 45°$ when the phase of the output pulse from the delay element at the center position of the delay elements of the plural stages is made the reference, the maximum noise reduction effect in the FM band can be obtained. The above clock modulator of the present invention is characterized in that the phase delay time $\tau$ is set to about 0.8% of a period of the fundamental clock pulse.

Like the structure of the present invention, when the phase delay time $\tau$ is set to about 0.8% of the period of the fundamental clock pulse, as shown in FIG. 2 of the present embodiment, the maximum noise reduction effect in the FM band can be obtained.

The clock modulator of the present invention is characterized by comprising a power supply voltage control portion for controlling power supply voltage applied to the delay elements of the respective stages. Besides, it is characterized in that the power supply voltage control portion comprises a D/A converter.

According to the structure of the present invention, in the case where a clock of a relatively low frequency is inputted, power supply voltage applied to the respective delay elements is lowered by the power supply voltage control portion to prolong the phase delay time $\tau$ of the respective delay elements, and in the case where a clock of a high frequency is inputted, the applied voltage is raised to shorten the phase delay time $\tau$ of the respective delay elements. By this, irrespective of the fundamental clock frequency, the phase delay time $\tau$ of the respective delay elements can be set to about 0.8% of the period of the fundamental clock pulse.

DESCRIPTION OF THE PREFERRED EMBODIMENTS OF THE INVENTION

Figure 1:
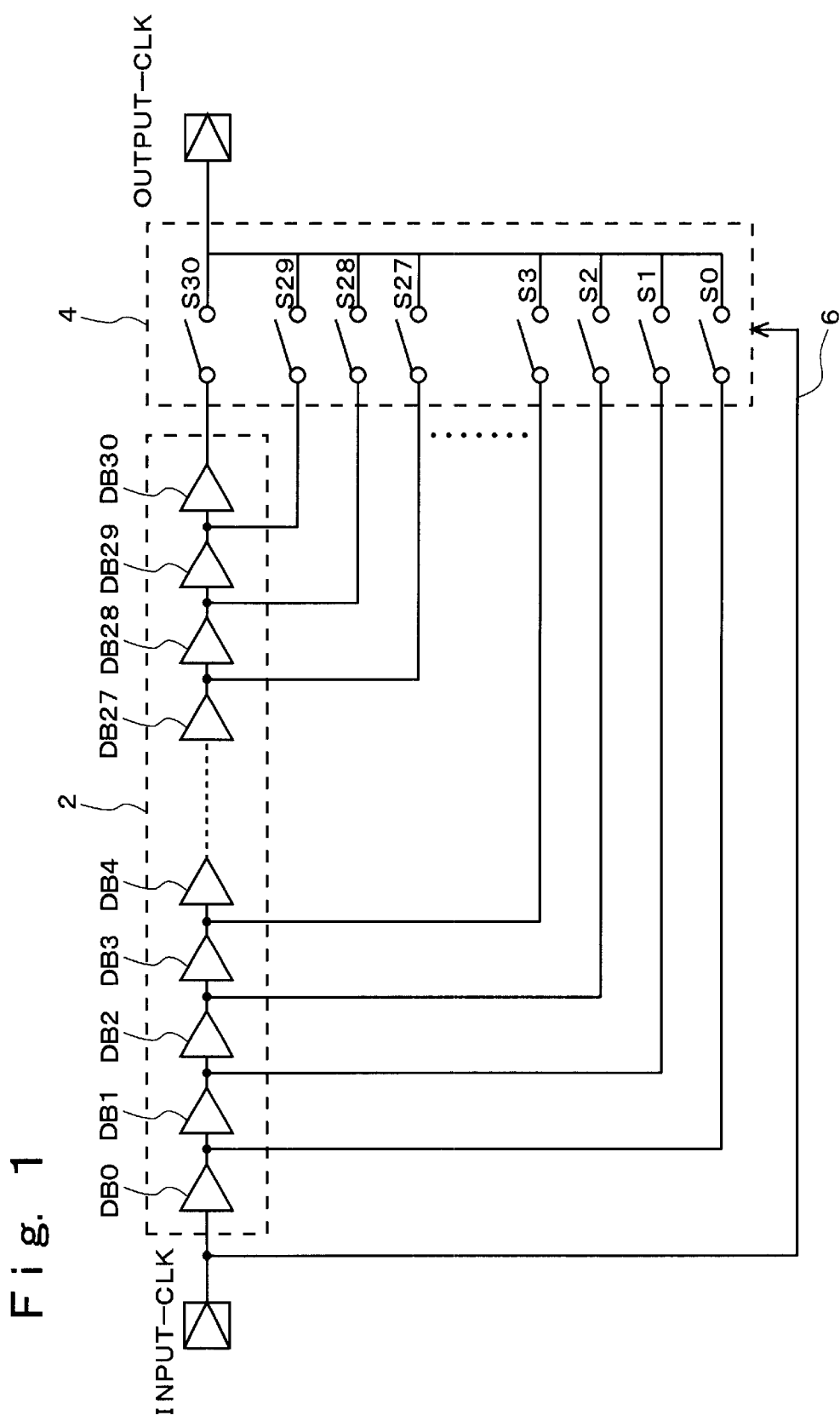
FIG. 1 shows a schematic structure of a clock modulator according to an embodiment of the present invention.

A clock modulator according to an embodiment of the present invention will be described with reference to FIGS. 1 to 4. First, a schematic structure of the clock modulator according to this embodiment will be described with reference to FIG. 1. As shown in FIG. 1, the clock modulator is roughly constituted by two circuits of a delay circuit 2 and a selection circuit 4.

The delay circuit 2 is constituted by a plurality of series connected delay elements (hereinafter referred to as delay buffers DB) made of digital logic circuits. In this embodiment, 31 delay buffers DB0 to DB30 are connected in series with each other in this order.

Each of the delay buffers DB delays the phase of an input clock pulse by a predetermined time and outputs the delayed output pulse. A fundamental clock pulse (input CLK) is inputted to the delay buffer DB0. A fundamental clock frequency of the input CLK is 16 MHz in this embodiment. An output terminal of the delay buffer DB0 is connected to an input terminal of the delay buffer DB1 and is connected to a switch circuit S0 in the selection circuit 4. In the same way, an output terminal of the delay buffer DB1 is connected to an input terminal of the delay buffer DB2 and is connected to a switch circuit S1 in the selection circuit 4. Hereinafter, in the same way, output terminals of the respective delay buffers DB3 to DB29 are sequentially connected to input terminals of the delay buffers DB4 to DB30 of the next stages and are connected to switch circuits S2 to S29 in the selection circuit 4. An output terminal of the delay buffer DB30 is connected to a switch 30 in the selection circuit 4.

Like this, the 31 switch circuits S0 to S30 are provided in the selection circuit 4. The input CLK is not only inputted to the input terminal of the delay buffer DB0, but also directly inputted, as a selection signal 6 for making any one of the switch circuits S0 to S30 have an ON state, to the selection circuit 4 without passing through the delay circuit 2. The switch circuits S0 to S30 are structured such that every time the selection signal 6 is inputted to the selection circuit 4, for example, only one switch of the switch circuits S0 to S30 is closed (ON state) in synchronization with a rising edge of the selection signal 6, and all the remaining switches have open states (OFF states). The ON state of the switch is transferred from the switch circuit S0 to the switch circuit S30 in the ascending order at equal time intervals, and after the switch circuit 30 is selected, the ON state is inversely transferred from the switch circuit S29 to the switch circuit S0 in the descending order. Thus, when characters of the switch circuits in which the switches come to have the ON state are sequentially set forth, they become S0, S1, S2, . . . , S28, S29, S30, S29, S28, . . . , S2, S1, S0, S1, S2, . . . . The clock pulses the phase of each of which is delayed at each stage by a predetermined time become a continuous clock pulse train again and are outputted from an output terminal of the selection circuit 4.

In this way, from the output terminal of the selection circuit 4, in the period of 30 cycles in which the switches of the switch circuits S0 to S30 are selected in the ascending order, 31 output clock pulses (output CLKs) the phases of which are sequentially delayed relatively from the phase of the input CLK are outputted, and then, in the period of 30 cycles in which the switches of the ON state are selected in the descending order from the switch circuit S30 to the switch circuit S0, 31 output CLKs the phases of which sequentially advance relatively with respect to the phase of the input CLK are outputted.

The fundamental frequency of the input CLK is made a center frequency Fc (=16 MHz), and the clock pulses outputted from the selection circuit 4 are shaped by a not-shown shaping circuit, so that from this clock modulator, the clock pulses of two frequencies of Fc−α (Hz) and Fc+α (Hz) are alternately outputted every predetermined time T1. Here, since the predetermined time T1 is equal to a time in which the switch circuits S0 to S30 are selected in the ascending order or descending order, T1=30·t1 (time t1 is a time in which one switch keeps the ON state in theory).

By this, the spectra of respective harmonic components of the fundamental clock frequency of the input CLK are also respectively divided into two frequencies and are alternately generated every predetermined time T1. Thus, in the clock modulator of this embodiment, at both sides of the frequency Fc and at positions apart therefrom by α (Hz), two spectra having lowered amplitude levels are alternately generated every predetermined time T1, and at both sides of the respective harmonic components of the frequency Fc as well, two spectra having lowered amplitude levels are alternately generated every predetermined time T1. In the case where the center frequency of the input CLK is 16 MHz, its period Tc is Tc=62.5 ns. Thus, in the case where the phase delay time τ per each stage of the delay buffers DB is τ=±0.5 ns, Fc−α=1/(62.5 (ns)+0.5 (ns))=15.87 (MHz), and Fc+α= 1/(62.5 (ns)−0.5 (ns))=16.13 (MHz).

Like this, by using the clock modulator, the phase modulated clock pulses can be obtained, and it becomes possible to reduce the undesired radiant noise by the spectral dispersion. Next, in order to obtain excellent reduction of the undesired radiant noise, optimization of the delay circuit 2 of the clock modulator will be described.

Figure 2:
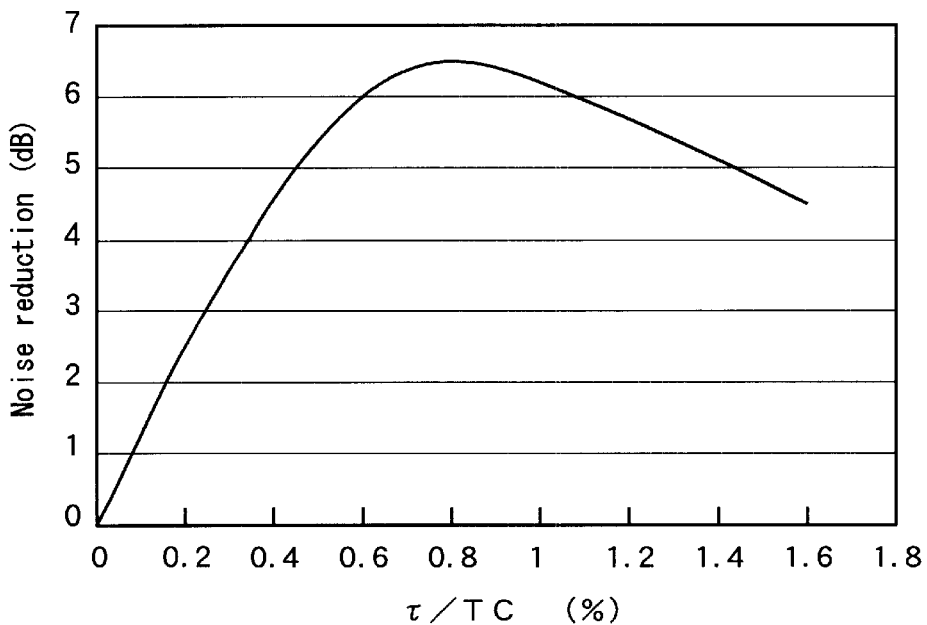
FIG. 2 shows the relation between a phase delay time $\tau$ per each stage of delay buffers DB in the clock modulator of the embodiment of the present invention and a noise reduction effect of an FM band.

First, the phase delay time T per each stage of the 31 delay buffers DB0 to DB30 incorporated in the delay circuit 2 is adjusted. FIG. 2 shows the relation between the phase delay time τ per each stage of the delay buffers DB and the noise reduction effect of the FM band. In FIG. 2, the horizontal axis indicates the ratio (%) of the phase delay time τ per each stage of the delay buffers DB to the period Tc of the input CLK. As described above, when the fundamental clock frequency Fc of the input CLK is Fc=16 MHz, the period Tc of the input CLK becomes 62.5 ns. Thus, the horizontal axis indicates τ/Tc (%)={τ(ns)/62.5}×100 (%). The vertical axis indicates the magnitude of noise reduction of the FM band in dB (decibel).

As shown in FIG. 2, by changing the phase delay time τ per each stage of the delay buffers DB, a noise reduction amount N is changed. As shown in the drawing, when the value τ/T of the horizontal axis is near 0.8%, the maximum noise reduction amount of about 6.5 dB is obtained. When τ/Tc is 0.8%, the phase delay time T per each stage of the delay buffers DB becomes=0.5 ns. Incidentally, in the case where the phase delay time τ per each stage of the delay buffers DB is made 0.2 ns, the value τ/Tc of the horizontal axis becomes 0.32%. In the case where the phase delay time τ is made 1.0 ns, τ/Tc (%) becomes 1.6%. As shown in the drawing, also in the case where the value τ/Tc (%) of the horizontal axis is 0.32% or 1.6%, the noise reduction effect can be obtained. However, the highest noise reduction effect can be obtained in the case of approximately 0.8%. As a result, it is desirable that the phase delay time τ of each stage of the delay buffers DB is set to about 0.8% of the period Tc of the input CLK.

Next, a description will be made on a fact that the noise reduction effect can be further obtained by optimizing the maximum phase variation with respect to the input CLK in the output CLK outputted from the selection circuit 4.

Figure 3:
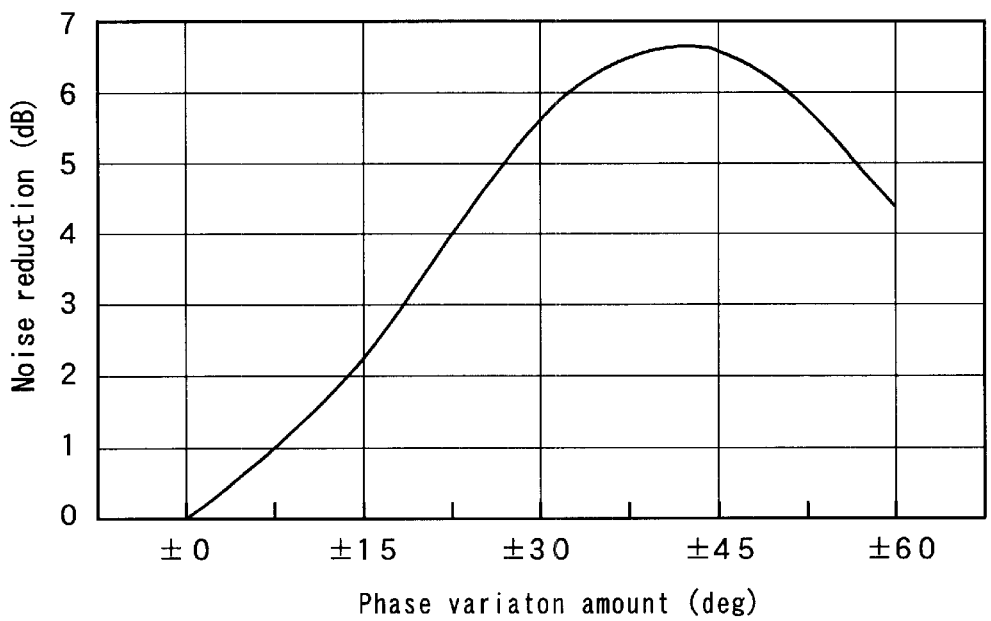
FIG. 3 shows the relation between a phase variation amount in the clock modulator of the embodiment of the present invention and a noise reduction effect.

FIG. 3 shows the relation between a phase variation amount (phase delay amount) and a noise reduction effect. The horizontal axis indicates the phase variation amount Dp (deg) of the output CLK to the input CLK. The vertical axis indicates the magnitude of noise reduction of the FM band in dB (decibel).

For example, in the clock modulator shown in FIG. 1, in the case where the phase delay time τ per each stage of the delay buffers DB is =0.5 ns, the phase variation amount Dt (ns) of the output CLK outputted from the 31 stage delay buffers DB0 to DB30 becomes Dt=0.5 ns×30=15.0 ns. Thus, the phase variation amount Dp to the phase of the input CLK of the fundamental frequency Fc=16 MHz becomes Dp=360°×(15.0/62.5)≅90°. When the phase of the output pulse outputted from the delay buffer DB15 positioned at the center of the delay buffers DB0 to DB30 is made a reference, the phase variation amount Dp is expressed as ±45°.

In the same way, for example, if the number of stages of the delay buffers DB is 10, the phase variation amount Dp becomes Dp=360°×(5.0/62.5)≅30°, and in the case where the center of the delay buffer DB is made a reference, it is expressed as ±15°.

In the case where the number of stages of the delay buffers DB is 40, the phase variation amount Dp becomes Dp=360°×(20.0/62.5)≅120°, and in the case where the center of the delay buffer DB is made a reference, it is expressed as ±60°.

When the noise reduction amount is measured with respect to each phase variation amount like this, the graph shown in FIG. 3 is obtained. As shown in FIG. 3, in the case where the phase variation amount Dp is set between Dp=±15° to ±60°, the noise reduction effect is seen in each case. However, it is understood that the noise of the FM band is exceedingly reduced near Dp=±45°. As a result, it is desirable that the phase variation amount of the output of the delay buffer DB0 of the first stage of the delay circuit 4 and the delay buffer DB30 of the final stage are made near ±45° when the phase of the output pulse of the delay buffer DB15 positioned at the center of the delay buffers DB0 to DB30 is made a reference.

As described above, the phase delay time τ of each stage of the delay buffers DB is set to about 0.8% of the period Tc of the input CLK, or in addition to that, adjustment is made such that the phase variation amount of the output of the delay buffer DB0 and the delay buffer DB30 are made approximately ±45° with respect to the phase of the output pulse of the delay buffer DB15. By this, as an operation clock of a circuit operating in synchronization with a clock, such as a microcomputer, ASIC or SDRAM, the output CLK outputted from the clock modulator of the embodiment can be used, and it becomes possible to take the optimum EMI countermeasure.

According to the clock modulator of this embodiment, it becomes possible to effectively suppress the undesired radiant noise without causing enlargement of the circuit scale. According to an actual measurement result using evaluation samples, by using the clock modulator of the embodiment, it was possible to reduce the undesired radiant noise of the FM band, which became a problem in an in-vehicle LSI substrate, by about 6 db.

The present invention is not limited to the above embodiment, but various modifications can be made.

For example, in the above embodiment, although the present invention has been applied to the case where the fundamental clock frequency of the input CLK is 16 MHz, the present invention can be naturally applied to the input CLK of a fundamental clock frequency different from that.

For example, a description will be made of a case where, with respect to the delay circuit 2 including the 31 stage delay buffers DB0 to DB30 as shown in FIG. 1, the fundamental frequency Fc of the input CLK is 8 MHz. The period Tc of the input CLK becomes Tc=125 ns. Thus, if the phase delay time τ per each stage of the delay buffers DB0 to DB30 remains τ=0.5 ns, τ/Tc (%)={0.5 (ns)/125}×100 (%)=0.4%, and the phase delay time τ of each stage of the delay buffers DB does not become near 0.8% of the period Tc of the input CLK.

Since the phase variation amount Dt (ns) of the output CLK from the selection circuit 4 remains Dt=15.0 ns, the phase variation amount Dp (deg) to the input CLK of the fundamental clock frequency Fc=8 MHz becomes Dp=360°×(15.0/125)≅45°. Thus, in the case where the phase of the output pulse from the delay buffer DB15 positioned at the center of the delay buffers DB0 to DB30 is made a reference, the phase variation amount becomes about ±22°, and it deviates from a value near ±45° where the optimum noise reduction effect can be obtained.

Figure 4:
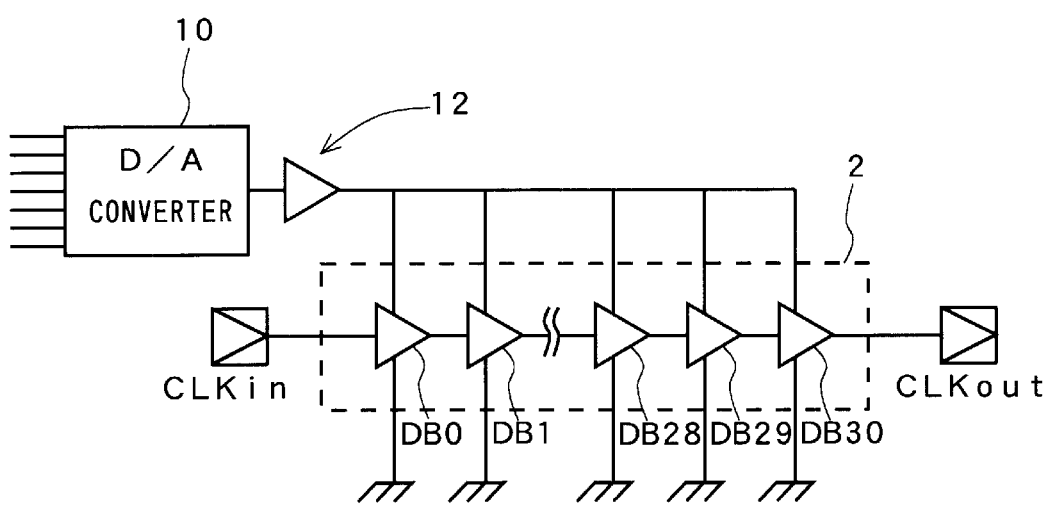
FIG. 4 shows an example of a structure in which output voltage from a D/A converter 10 is applied through a buffer amplifier 12 to respective delay buffers DB in a delay circuit 2 of the clock modulator of the embodiment of the present invention.

In this case, such a structure has only to be adopted that in accordance with the fundamental clock frequency Fc, the phase delay time τ per each stage of the delay buffers DB in the delay circuit 2 can be changed. For example, the phase delay time τ can be changed by changing the operation voltage of each of the delay buffers DB in the delay circuit 2. Then, as shown in FIG. 4, a power supply voltage control portion, which can change power supply voltage applied to the respective delay buffers DB, may be provided. A D/A converter, a regulator or the like can be used for the power supply voltage control portion. FIG. 4 shows an example of a structure in which output voltage from the D/A converter 10 is applied through a buffer amplifier 12 to the respective delay buffers DB in the delay circuit 2.

In the case where it is used for the input CLK of a relatively low frequency, an input value to the D/A converter is set low to decrease the power supply voltage applied to the respective delay buffers DB, and in the case where it is used for the input CLK of a high frequency, an input value to the D/A converter 10 is set high to raise the power supply voltage applied to the respective delay buffers DB. By this, even if the frequency of the input CLK is changed, it becomes possible to obtain the optimum phase variation amount D. Incidentally, as shown in FIG. 4, although the buffer amplifier 12 is provided at the output of the D/A converter 10, if the output driving capacity of the D/A converter 10 is sufficient, this is not always required.

As described above, according to the present invention, it becomes possible to optimally reduce undesired radiant noise by a low spectral dispersion number.

What is claimed is:

1. A clock modulator comprising:
   a delay circuit having delay elements of plural stages which are connected in series with each other from a first stage to a final stage, wherein each of the delay elements outputs an output pulse delayed from an input pulse by a phase delay time τ; and
   a selection circuit sequentially selecting the output pulse outputted from each of the delay elements of the plural stages;
   wherein with respect to a fundamental clock pulse inputted to the delay element of the first stage, a phase variation amount of the output pulse from the delay element of the first stage and a phase variation amount of the output pulse from the delay element of the final stage are near ±45° when a phase of the output pulse from the delay element at a center position of the delay elements of the plural stages is made a reference.

2. A clock modulator according to claim 1, wherein the phase delay time $\tau$ is set to about 0.8% of a period of the fundamental clock pulse.

3. A clock modulator according to claim 1, further comprising a power supply voltage control portion controlling power supply voltage applied to the delay element of each of the stages.

4. A clock modulator according to claim 3, wherein the power supply control portion comprises a D/A converter.

* * * * *